US012095895B1

(12) United States Patent
Kanaris et al.

(10) Patent No.: US 12,095,895 B1
(45) Date of Patent: Sep. 17, 2024

(54) SYSTEM FOR TIME SYNCHRONIZATION (71) Applicant: AMAZON TECHNOLGOES, INC., Seattle, WA (US)

(72) Inventors: Alexander Kanaris, San Jose, CA (US); Berkant Tacer, Bellevue, WA (US); Carlo Murgia, Santa Clara, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 19 days.

(21) Appl. No.: 17/930,572

(22) Filed: Sep. 8, 2022

(51) Int. Cl.
*H04L 7/033* (2006.01)
*G06F 1/12* (2006.01)
*H03L 7/08* (2006.01)

(52) U.S. Cl.
CPC .............. *H04L 7/033* (2013.01); *G06F 1/12* (2013.01); *H03L 7/08* (2013.01)

(58) Field of Classification Search
CPC ..................................................... H04L 7/033
USPC ....................................................... 375/355
See application file for complete search history.

(56) References Cited

U.S. PATENT DOCUMENTS

| | | | | |
|---|---|---|---|---|
| 6,282,209 B1 * | 8/2001 | Kataoka | ............. | H04N 21/6587 375/E7.02 |
| 2015/0308399 A1 * | 10/2015 | Hoban, Jr. | .............. | F02D 41/20 123/406.12 |
| 2016/0352826 A1 * | 12/2016 | Zhou | ..................... | H04L 65/613 |

OTHER PUBLICATIONS

Lei, et al., "Hybsync: Nanosecond Wireless Position and Clock Synchronization Based on UWB Communication with Multisensors", Hindawi, Journal of Sensors, vol. 2021 Article ID 9920567, Mar. 26, 2021, 12 pgs. Retrieved from the Internet: URL: https://www.hindawi.com/journals/js/2021/9920567/.

Mills, et al., "Network Time Protocol Version 4", Internet Engineering Task Force, Jun. 2010, 95 pgs. Retrieved from the Internet: URL: https://www.ietf.org/rfc/rfc5905.txt.

* cited by examiner

*Primary Examiner* — Lihong Yu
(74) *Attorney, Agent, or Firm* — Lindauer Law, PLLC (57) ABSTRACT

Maintaining time synchronization between clocks of different devices allows various operations, such as accurate timestamping input data, coordinating presentation of output, and so forth. A pairwise synchronization between a first and second device is provided by opportunistically including timing data within packets transmitted between the devices. A clock sync module in a second device uses a software-implemented phase-locked loop (PLL) with a software-implemented proportional-integral-derivative (PID) controller to synchronize a second clock in the second device to a first clock of the first device. The use of the clock sync module to process the timing data provides clock synchronization without introducing jitter or other undesirable effects at the second device. Using the clock sync module, the timing of the second clock of the second device quickly converges with the first clock. The close convergence facilitates time-sensitive operations, such as synchronizing presentation of content from many participating wireless devices.

20 Claims, 5 Drawing Sheets

SYSTEM FOR TIME SYNCHRONIZATION

This disclosure incorporates by reference the material submitted in the Computer Program Listing Appendix filed herewith.

BACKGROUND

A plurality of devices may maintain synchronization to a common clock to facilitate various operations.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features. The figures are not necessarily drawn to scale, and in some figures, the proportions or other aspects may be exaggerated to facilitate comprehension of particular aspects.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

DETAILED DESCRIPTION

A device located in a home, business, vehicle, and so forth may be capable of performing various tasks. These tasks may include presenting audio content via speakers, acquiring audio input, and so forth. Each device may have a clock. Due to variations in make, model, manufacture, temperature, and so forth, each of these clocks may report different times. For example, the time reported by a first clock may be skewed, relative to a second clock. Some tasks involve operations that are time sensitive. Presentation of audio content from different speakers to provide effects such as multi-channel stereo effects is facilitated by time synchronization. For example, if a first device plays a portion of the audio content before a second device, this may be perceived by a user as an undesirable echo. Acquisition of input data may also benefit from time synchronization. For example, samples of audio input from multiple devices that are time synchronized may be combined using beamforming or other techniques to improve a signal-to-noise ratio of a user speaking a command aloud.

Traditional techniques for time synchronization across devices on a network exhibit several drawbacks. For example, the Network Time Protocol (NTP) uses dedicated packets to exchange timing information, which consumes network bandwidth. In another example, even under ideal conditions on a local area network, NTP is considered to only provide accuracy of approximately 1 millisecond. With real-world effects, such as network congestion, interference on a wireless connection, and so forth, achieved accuracy is substantially less. Additionally, the time taken for the clocks using NTP to converge on a value, even at this relatively poor accuracy, can be substantial. Poor accuracy results in poor synchronization, producing poor performance and a poor user experience.

Described in this disclosure are techniques and systems for synchronizing a second clock of a second device to a first clock of a first device using time data included in packet headers using a software-implemented phase-locked loop (PLL) having a proportional-integral-derivative (PID) controller as a loop filter. As packets are exchanged between the first device and the second device, time data is used. For example, the first device may send packets comprising headers with the time data as well as payload data comprising sample data (such as audio data) to the second device. The second device may then use the time data to synchronize the second clock to the first clock and present the sample data based on timing signals from the now synchronized second clock. Continuing the example, the second device may send packets comprising headers with time data to the first device as well as payload data such as input data acquired by the second device.

Unlike traditional methods that utilize a request and reply, the approach described in this disclosure eliminates that latency and reduces convergence time. The inclusion of time data in the packet headers allows for an opportunistic transfer of information with no or extremely minimal network overhead. This results in a substantial increase in the time data available to the participating devices, further facilitating reductions in convergence time. The substantial increase in the time data available for use also allows for a substantial increase in accuracy of the converged time. For example, using the techniques and systems described in this disclosure, a convergence time of approximately 2.4 seconds will result in a clock error of approximately 2.5 microseconds. This is a substantial improvement over the 1 millisecond (1,000 microseconds) associated with NTP.

The inclusion of time data in the packet headers allows for an opportunistic transfer of information with no or extremely minimal network overhead. This substantially reduces or eliminates additional network traffic compared to traditional methods using dedicated packets to send clock synchronization information.

By using the systems and techniques described in this disclosure, devices on a network are able to quickly and efficiently perform time synchronization between pairs of devices. Once synchronized, the devices are able to perform a variety of time-synchronized operations.

ILLUSTRATIVE SYSTEM

Figure 1:
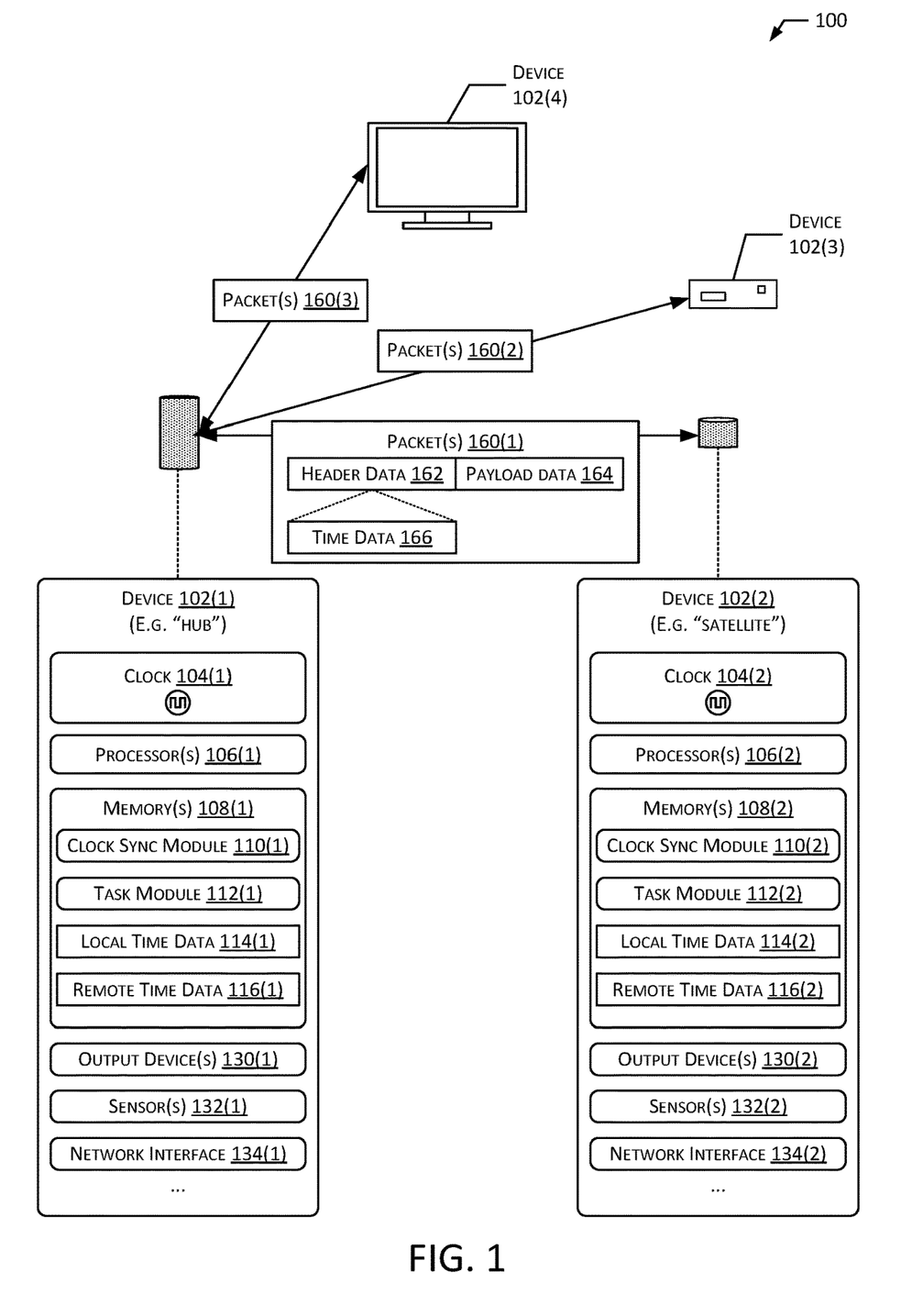
FIG. 1 illustrates a system including a first device having a first clock and a second device with a second clock that synchronizes to the first clock, according to some implementations.

FIG. 1 illustrates a system 100 including a first device 102(1) and a second device 102(2), according to some implementations. The devices 102 may be fixed, portable, mobile, and so forth. For example, a fixed device may comprise a display device that is mounted to a wall. Continuing the example, a portable device may be a tabletop device that may be relocated to another location. Further continuing the example, a mobile device may be manually moved or may move using its own actuators such as motors.

In this illustration the system 100 is shown as including devices 102(1), 102(2), 102(3), and 102(4). These four devices 102 are shown by way of illustration, and not necessarily as a limitation. In some implementations, the system 100 may include two devices 102(1) and 102(2), or some other plurality of devices 102(N) where "N" is a nonzero positive integer.

Each device 102 may include a power supply (not shown), one or more clocks 104, one or more processors 106, one or more memories 108, one or more output devices 130, one or more sensors 132, one or more network interfaces 134, and so forth.

The power supply may comprise circuitry connected to electrical mains, wireless power transfer devices, batteries, capacitors, fuel cells, photovoltaics, storage flywheels, and so forth.

The one or more clocks 104 may provide information indicative of date, time, ticks, and so forth. For example, the processor 106 may use data from the clock 104 to associate a particular time with an action, to coordinate operation of an output device 130 to present output at a specified time, to timestamp sensor data using the sensors 132, and so forth. The clock 104 may be operated based on output from a clock sync module 110, as described below.

The one or more hardware processors 106 (processors) are configured to execute one or more stored instructions. The processors 106 may comprise one or more cores. The processors 106 may include microcontrollers, systems on a chip, field programmable gate arrays, digital signal processors, graphic processing units, general processing units, and so forth.

The memory 108 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 108 provides storage of computer-readable instructions, data structures, program modules, and other data for the operation of the device 102. Two example functional modules are shown stored in the memory 108, although the same functionality may alternatively be implemented in hardware, firmware, or as a system on a chip (SoC).

The output devices 130 may comprise one or more of speakers, lights, display devices, haptic devices, and so forth. The sensors 132 may comprise one or more of microphone(s), buttons, touch sensors, touchscreens, accelerometers, cameras, and so forth.

Each device 102 includes one or more network interfaces 134. The network interfaces 134 may include devices to connect to personal area networks (PANs), local area networks (LANs), wireless local area networks (WLANS), wide area networks (WANs), and so forth. For example, the network interfaces 134 may include devices compatible with Ethernet, Wi-Fi, Bluetooth, Bluetooth Low Energy, ZigBee, and so forth. In some implementations, a network interface 134 may be used as a sensor 132.

The memory 108 may store a clock sync module 110. The clock sync module 110 provides clock synchronization functionality as described in this disclosure. The clock sync module 110 may perform different functions, based on a role associated with a particular device 102. These roles may include a device 102 operating as a "hub" or a "satellite". The device 102 operating as the "satellite" will synchronize, in pairwise fashion, its local clock 104 to the remote clock 104 of the "hub". The first device 102(1) that is acting as a "hub" uses the clock sync module 110 to determine local time data 114 and remote time data 116. The local time data 114 may be indicative of times, based on the local clock 104, when the first device 102(1) sent packets to the second device 102(2) or received packets from the second device 102(2). The remote time data 116 may comprise time data that is received from the second device 102(2), such as time data included in packet 160 header data 162. Operation of the clock sync module 110 is discussed in more detail with regards to FIGS. 2-4B.

The memory 108 may store one or more task modules 112. The task modules 112 may be used to perform tasks such as presenting sample data such as audio data, video data, and so forth using one or more of the output devices 130. For example, an audio task module may accept the audio data as input and use the speakers of the device 102 to provide audio output. In another example, an input module may use one or more microphones to acquire audio input.

During operation, the network interfaces 134 of respective devices 102 are used to send information to other devices 102 on the network. For example, the first device 102(1) may send sample data such as audio data representing music to a second device 102(2) for synchronized presentation using speakers from both devices 102. The devices 102 use the network interfaces 134 to send information in packets 160. Each packet 160 comprises header data 162 and payload data 164.

The header data 162 may comprise information such as a source network address, destination network address, packet sequence number, and so forth. The header data 162 also comprises time data 166. The time data 166 is used by the clock sync module 110. For example, the time data 166 may comprise information indicative of the clock time (based on the clock 104 of the sending device 102) when a particular packet 160 was transmitted. In some implementations a correction factor may be applied to accommodate time spent processing and transmitting a particular packet 160. The time data 166 may comprise a value indicative of a particular time that is associated with a particular time with respect to a particular epoch or start point, an index value, and so forth. For example, the index value may be indicative of a transmission time for the particular packet 160. In some implementations the time data 166 may be encrypted.

The payload data 164 may comprise the portion of the packet 160 that conveys information intended for transfer. The payload data 164 may be associated with operation of an application, operating systems, network management systems, and so forth. In some implementations the time data 166 may be sent in the payload data 164 or included as a payload header within the payload data 164. For example, the payload data 164 may comprise sample data such as frames of data comprising digitized samples of audio, video, and so forth. In another example, the payload data 164 may comprise sensor data acquired using one or more of the sensors 132 that is then sent to another device 102, server, and so forth. In still another example, the payload data 164 may comprise messages associated with operation of the system 100 or portions thereof.

During operation of the system 100, a device 102 may be designated as a hub that, among other functions, will serve as a timekeeper for operations associated with the system 100. For example, the clock 104 of the hub device 102 may serve as a reference clock to which other clocks 104 in other satellite devices 102 on the network will be synchronized. The clock 104 of the hub device 102 serving as reference may be more or less accurate than other clocks 104 in the system 100. Regardless of such differences in capabilities or operation, the clock sync module 110 in the satellite devices 102 may be synchronized to the clock 104 of the hub device 102.

In some implementations, the clock 104 of the hub that is serving as reference on the network may itself be synchronized to an external time source. For example, if the device 102 includes a Global Positioning System (GPS) receiver, the hub device 102 may use this information to attempt to synchronize its clock 104 to the stratum 0 time provided by the GPS receiver.

A particular device 102 may be designated as a hub based on one or more techniques. For example, the device 102 having a greatest (latest) serial number may be designated as a hub. In another example, a device 102 may be specifically designed at manufacture or installation as a hub. In yet another example, the device 102 that is able to receive the greatest received wireless signal from an access point may be designated as a hub. In still another example, the hub may be randomly selected from a set of devices 102.

In this illustration, the device 102(1) has been deemed the "hub" and will provide reference time to the other devices 102, such as device 102(2) that is deemed a "satellite". The hub device 102(1) sends packets 160 to the satellite device 102(2). For example, the hub device 102(1) may send packets 160(2) to the third device 102(3) and the hub device 102(1) may send packets 160(3) to the fourth device 102(4). The satellite device 102(2) also sends packets 160 to the hub device 102(1). As mentioned above, at least some of these packets 160 include time data 166.

Figure 2:
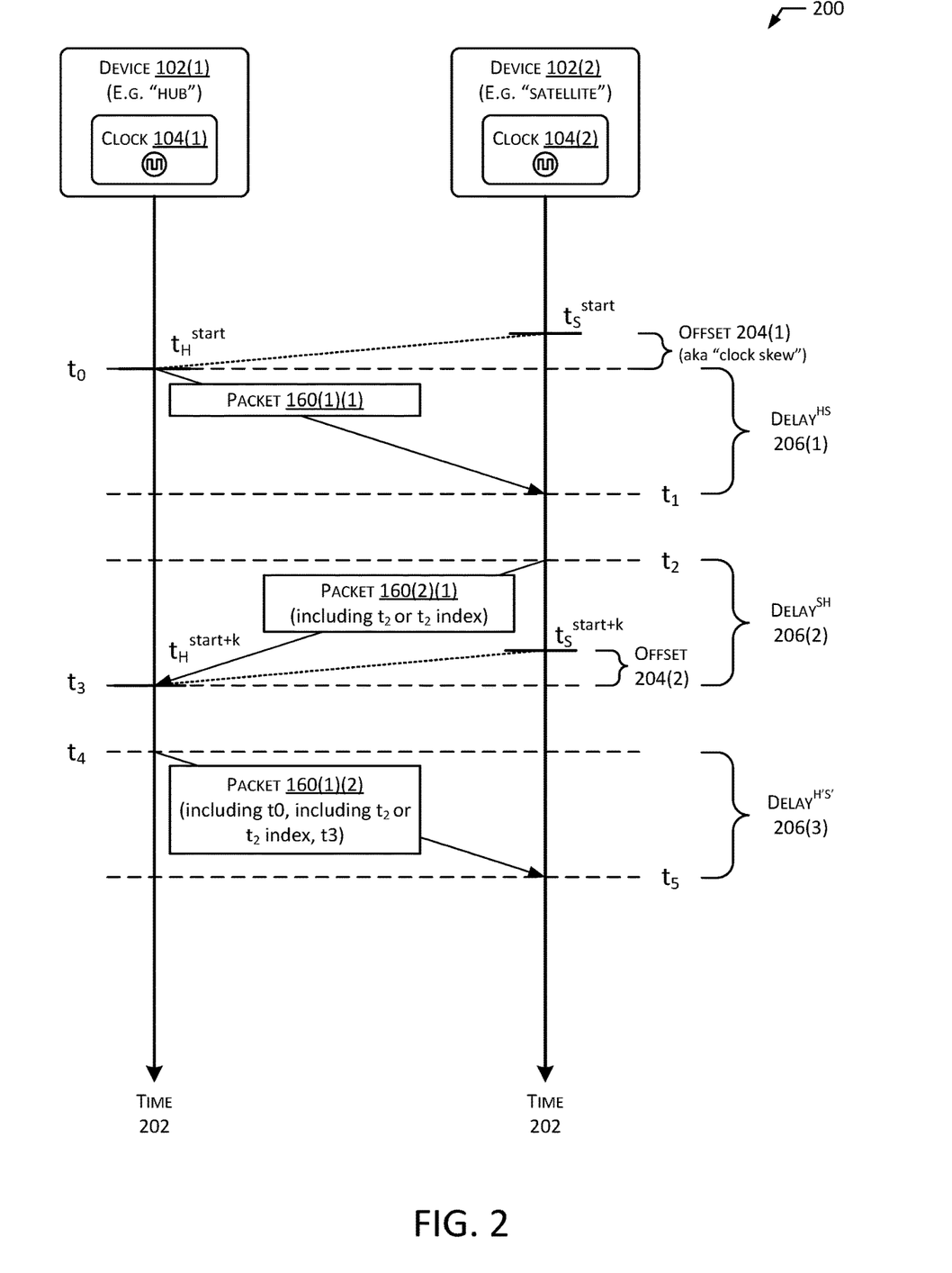
FIG. 2 illustrates timing and packets sent between the first and second devices to provide time data used for time synchronization by the second device, according to some implementations.

FIG. 2 illustrates at 200 timing and packets 160 sent between the first and second devices 102 to provide time data used for time synchronization by the second device 102(2), according to some implementations. In this illustration, hub device 102(1) and satellite device 102(2) are depicted, with time 202 shown, such that operations depicted at the top of the page occur before operations depicted at the bottom of the page.

The operations associated with the first or hub device 102(1) may be performed at least in part by the clock sync module 110(1). The operations associated with the second or satellite device 102(2) may be performed at least in part by the clock sync module 110(2).

During operation, clocks 104(1) and 104(2) will report different times. This may be due to variations in make, model, manufacture, temperature, and so forth. For example, clock 104(1) may exhibit more "ticks", oscillations, or other timekeeping increments per second than clock 104(2), or vice versa. In this illustration, hub clock 104(1) has a "tick" or increment that begins at $t_H^{start}$ while satellite clock 104(2) begins its increment for the same reported time at $t_S^{start}$. The difference between $t_H^{start}$ and $t_S^{start}$ is offset 204(1). The offset 204 may also be referred to as "clock skew".

At time to the hub device 102(1) sends a first packet 160(1)(1) to the satellite device 102(2). The first packet 160(1)(1) includes time data 166(1) that is indicative of to. As a result, the first packet 160(1)(1) includes information about when, according to the first clock 104(1), the first packet 160(1)(1) was sent using the network interface 134(1). The first packet 160(1)(1) is sent opportunistically.

For example, as the hub device 102(1) has data to send to the satellite device 102(2), the time data 166(1) is included.

At time $t_1$ the satellite device 102(2) receives the first packet 160(1)(1). The satellite device 102(2) determines the value of $t_1$ and stores this information for later use. The satellite device 102(2) also retains the value of to for later use. The difference between when the first packet 160(1)(1) was sent and received is delay$^{HS}$ 206(1).

At time $t_2$ the satellite device 102(2) sends a second packet 160(2)(1) to the hub device 102(1). The second packet 160(2)(1) includes time data 166(2) that is indicative of $t_2$. In some implementations an index value or other representation may be used as the time data 166(2). The index value may be indicative of a transmission time for the second packet 160(2)(1). As a result, the second packet 160(2)(1) includes information about when, according to the second clock 104(2), the second packet 160(2)(1) was sent using the network interface 134(2). The second packet 160(2)(1) is sent opportunistically. For example, as the satellite device 102(2) has data to send to the hub device 102(1), the time data 166(2) is included. In some implementations the second packet 160(2)(1) is not sent responsive to the first packet 160(1)(1).

At time $t_3$ the hub device 102(1) receives the second packet 160(2)(1). The hub device 102(1) determines the value of $t_3$ and stores this information for later use. The satellite device 102(2) also retains for later use the value of $t_2$ that was included in the second packet 160(2)(1). The difference between when the second packet 160(2)(1) was sent and received is delay$^{SH}$ 206(2).

At time $t_4$ the hub device 102(1) sends a third packet 160(1)(2) to the satellite device 102(2). The third packet 160(1)(2) includes time data 166(3) that is indicative of to, $t_2$, and $t_3$. The third packet 160(1)(2) may also include to, or information about when, according to the first clock 104(1), the third packet 160(1)(2) was sent using the network interface 134(1). This value of to, may then be used for a subsequent iteration of operation of the clock sync module 110 as described below.

The third packet 160(1)(2) is sent opportunistically. For example, as the hub device 102(1) has data to send to the satellite device 102(2), the time data 166(3) is included. In some implementations the third packet 160(1)(2) is not sent responsive to the second packet 160(2)(1).

At time $t_5$ the satellite device 102(2) receives the third packet 160(1)(2). The satellite device 102(2) may determine a value associated with a time received for subsequent iteration of operation of the clock sync module 110. The difference between when the third packet 160(2)(1) was sent and received is delay$^{H'S'}$ 206(3).

The satellite device 102(2) now has information sufficient to begin operation of the clock sync module 110(2) to synchronizing the second clock 104(2) to the first clock 104(1).

In some implementations the exchange of packets 160 between the hub device 102(1) and the satellite device 102(2) does not result from operation of the respective clock sync modules 110. For example, the first clock sync module 110(1) does not initiate sending the first packet 160(1)(1), the second clock sync module 110(2) does not initiate sending the second packet 160(2)(1), the first clock sync module 110(1) does not initiate sending the third packet 160(1)(2), and so forth. Furthermore, the clock sync modules 110 do not initiate sending packets 160 responsive to receiving a packet 160.

Instead, the system 100 may utilize an opportunistic mode of operation, including the time data 166 within packets 160 that are addressed to a participating device 102. The respective clock sync modules 110 may proceed to determine their respective local time data 114 and remote time data 116. As described above, time synchronization occurs between pairs of devices 102, in this example, devices 102(1) and 102(2). If a packet 160 is to be sent by one device 102 of the pair to the other, that packet 160 may include the time data 166.

The relationships between the various times depicted in FIG. 2 are described in the following equations:

$$t_1 = t_0 + Delay_{HS} + \text{Offset} \quad \text{(EQUATION 1)}$$

$$t_1 - t_0 = Delay_{HS} + \text{Offset} \quad \text{(EQUATION 2)}$$

$$t_3 = t_2 + Delay_{SH} - \text{Offset} \quad \text{(EQUATION 3)}$$

$$t_3 - t_2 = Delay_{SH} - \text{Offset} \quad \text{(EQUATION 4)}$$

Based on Equations 1-4, it is observed that there are two equations with three unknowns as expressed in the following equations:

$$Delay_{HS} + Delay_{SH} = t_1 - t_0 + t_3 - t_2 \quad \text{(EQUATION 5)}$$

$$2*\text{Offset} = t_1 - t_0 - t_3 + t_2 - Delay_{HS} + Delay_{SH} \quad \text{(EQUATION 6)}$$

A simplifying assumption may be made that the delays 206 between the pair of devices 102 is approximately equal. A first set of delays 206 may be determined with respect to packets 160 sent from device 102(1) to 102(2), and a second set of delays 206 determined with respect to packets 160 sent from 102(2) to 102(1). A minimum delay 206 may be determined from each set of delays where k is indicative of a period or iteration.

$$\min(Delay_{HS}^k) = \min(Delay_{SH}^k) \quad \text{(EQUATION 7)}$$

This assumption is reasonable as the minimum delay 206 is constrained to operation of the network interface(s) 134 that are communicating. This assumption may be maintained during operation. In one implementation, determination of subsequent offset 204 values may be limited to determination of a subsequent lesser minimum delay 206.

Given the previous equations and the assumption of Equation 7, the following equations may be determined:

$$\text{Delay} = (t_1 - t_0 + t_3 - t_2)/2 \quad \text{(EQUATION 8)}$$

$$\text{Offset} = (t_1 - t_0 - t_3 + t_2)/2 \quad \text{(EQUATION 9)}$$

As described above, given the interchange of time data 166 described with regard to FIG. 2, the clock sync module 110 has sufficient information to determine the delay 206 and offset 204 values that may be subsequently used by the clock sync module 110 to operate the clock 104.

Figure 3:
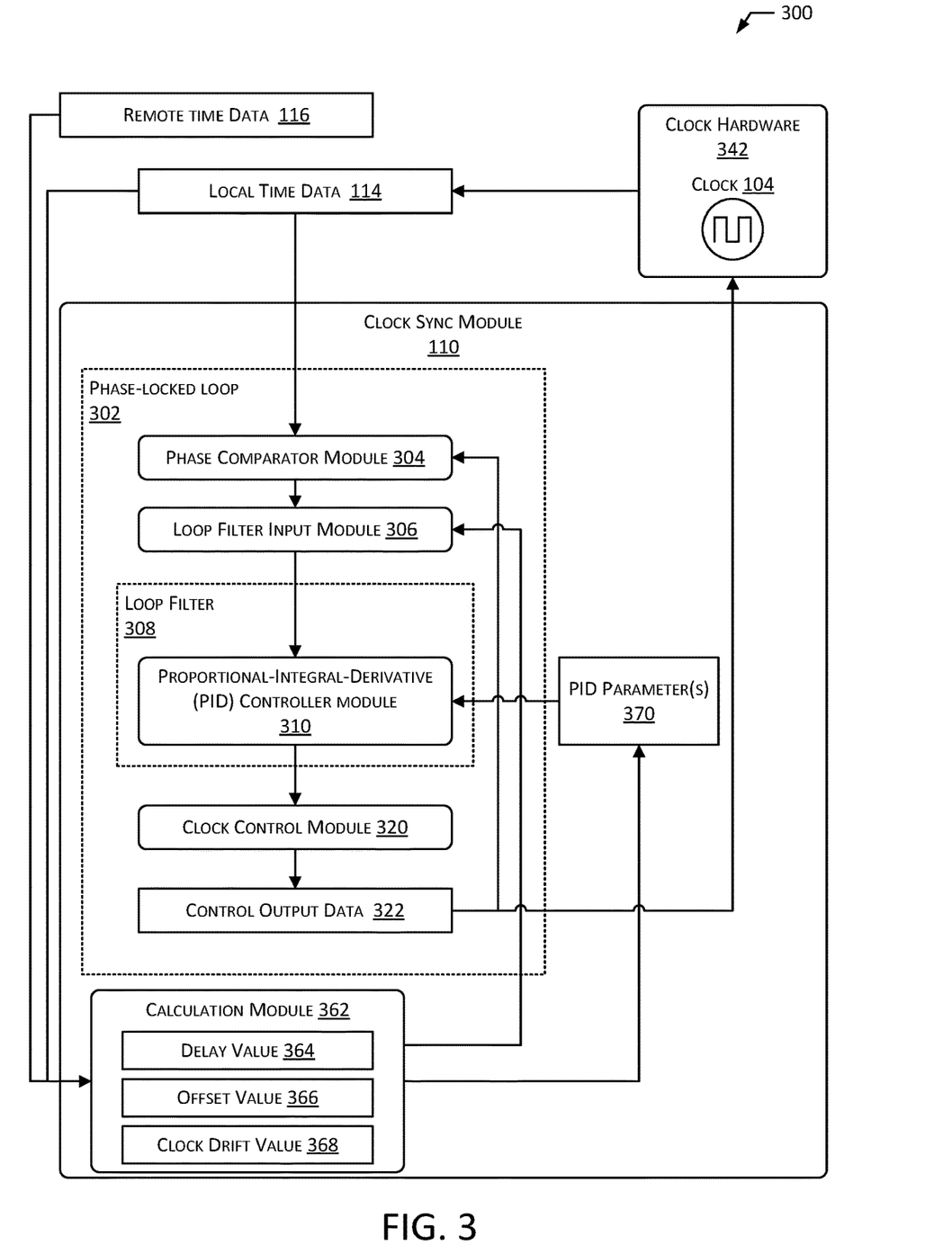
FIG. 3 is a block diagram of a clock sync module using a proportional-integral-derivative (PID) controller as a loop filter of a phase-locked loop (PLL) used to adjust a clock, according to some implementations.

FIG. 3 is a block diagram 300 of the clock sync module 110, according to some implementations. The clock sync module 110 may be executed on one or more processors 106 of a device 102.

The clock sync module 110 comprises a phase-locked loop (PLL) 302 and a calculation module 362. The clock sync module 110 provides control output data 322 to clock hardware 342. The clock hardware 342 comprises the clock 104 and associated circuitry.

The PLL 302 includes a phase comparator module 304, a loop filter input module 306, a loop filter 308, and a clock control module 320. The phase comparator module 304 determines a phase difference between local time data 114 determined by the local clock 104 and the control output data 322. The output from the phase comparator module 304 is processed by the loop filter input module 306 based on output from the calculation module 362. Data that passes through the loop filter input module 306 is then processed by the loop filter 308 before being provided to the clock control module 320 to determine the control output data 322.

With respect to a satellite device 102(2), the local time data 114 may comprise $t_1$ and $t_2$, while the remote time data 116 may comprise to, $t_2$ as sent in the third packet 160(1)(2), and $t_3$.

The loop filter input module 306 may filter, update, or modify the output from the phase comparator module 304 based on information from the calculation module 362. For example, if the delay value 364 is greater than a delay threshold value, such as "0" and the delay value 364 is less than a second threshold value, the data from the phase comparator module 304 may be provided to the loop filter 308. In some implementations the second threshold value may be based on an Nth quantile of previously determined delays.

The loop filter 308 comprises a proportional-integral-derivative (PID) controller module 310 that is operated using one or more PID parameters 370. In some implementations the PID parameters 370 may be determined based at least in part on the output from the calculation module 362. In other implementations, the PID parameters 370 may be static.

The calculation module 362 determines one or more values based on the local time data 114 and the remote time data 116. For example, the calculation module 362 may determine a delay value 364 indicative of the delay 206 using equation 8. In another example, the calculation module 362 may determine an offset value 366 indicative of the offset 204 using equation 9. The calculation module 362 may also determine a clock drift value 368. For example, the clock drift value 368 may be calculated as a difference between a first offset value 366 and a second offset value 366.

By using the loop filter input module 306 and the PID controller module 310 to filter the output from the phase comparator module 304 instead of using the output from the calculation module 362 to directly update the clock 104, the clock sync module 110 is able to update the clock 104 without introducing jitter or other adverse effects. For example, by using the loop filter input module 306 and introducing changes into the input of the PID controller module 310, the clock sync module 110 avoids directly applying the offset value 366 to the clock 104, resulting in jitter.

In some implementations, the use of the loop filter input module 306 and the PID controller module 310 constrains adjustments of the clock 104 such that they monotonically increase in most circumstances. For example, the control output data 322 may be constrained to direct the clock hardware 342 to report a later time value, not an earlier time value. In some circumstances, a negative offset 204 may be applied that adjusts the clock 104 to an earlier time. For example, during a first iteration, if the first offset 204 determined is a positive value, then the first correction may be negative, adjusting the clock 104 to an earlier time.

The use of the loop filter input module 306 and the PID controller module 310 may also constrain adjustments to the clock 104 such that changes to the local time data 114 reported by the clock hardware 342 will be limited to an interval that is less than a sample duration that is associated with payload data 164. For example, if the payload data 164 represents audio data that has a sample duration of 8 milliseconds, the adjustments to the clock 104 will be less than 8 ms.

Figure 4A:
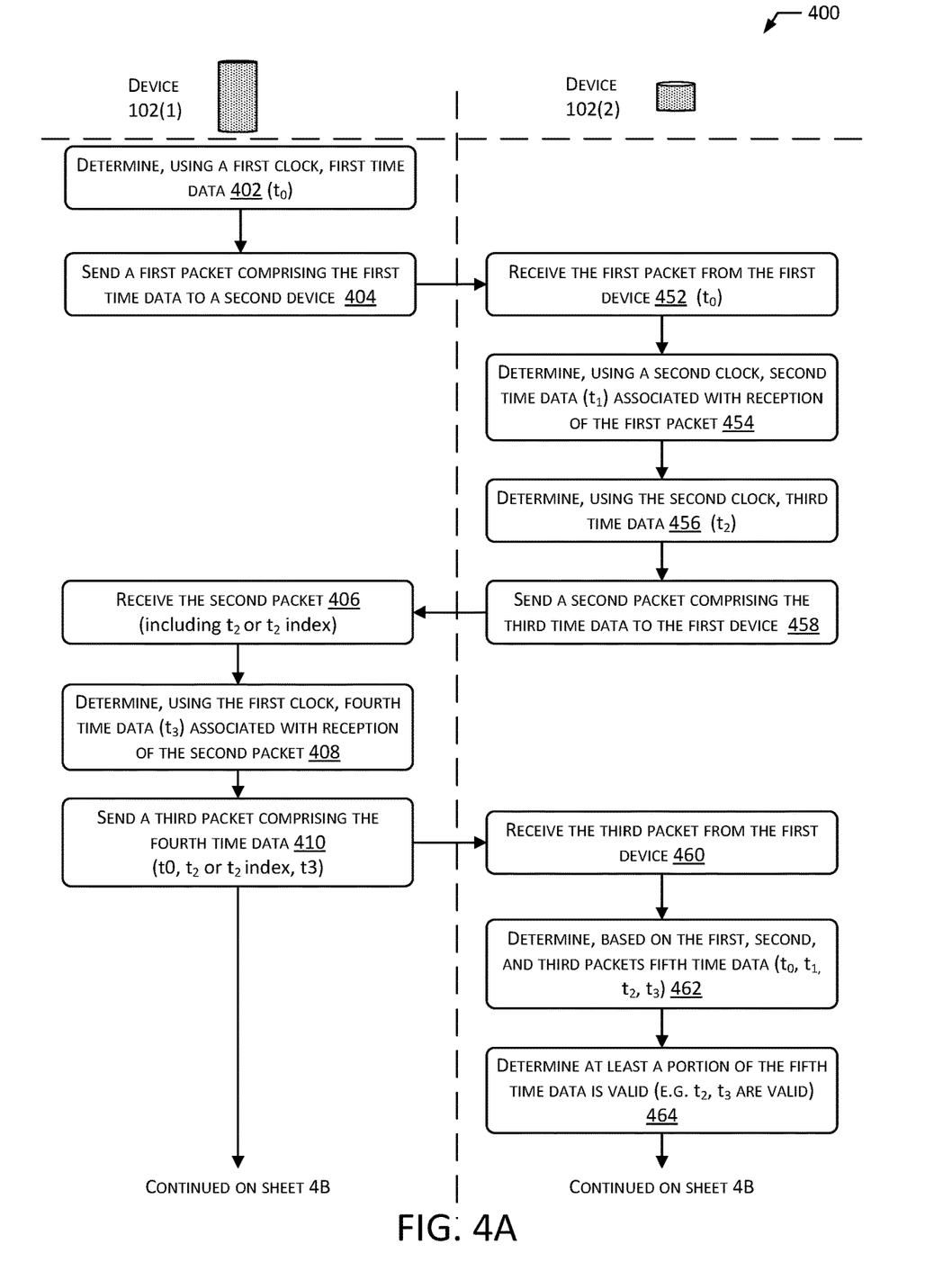
FIGS. 4A and 4B depict a flow diagram of a process for synchronizing a second clock of a second device with a first clock of a first device, according to some implementations.
Figure 4B:
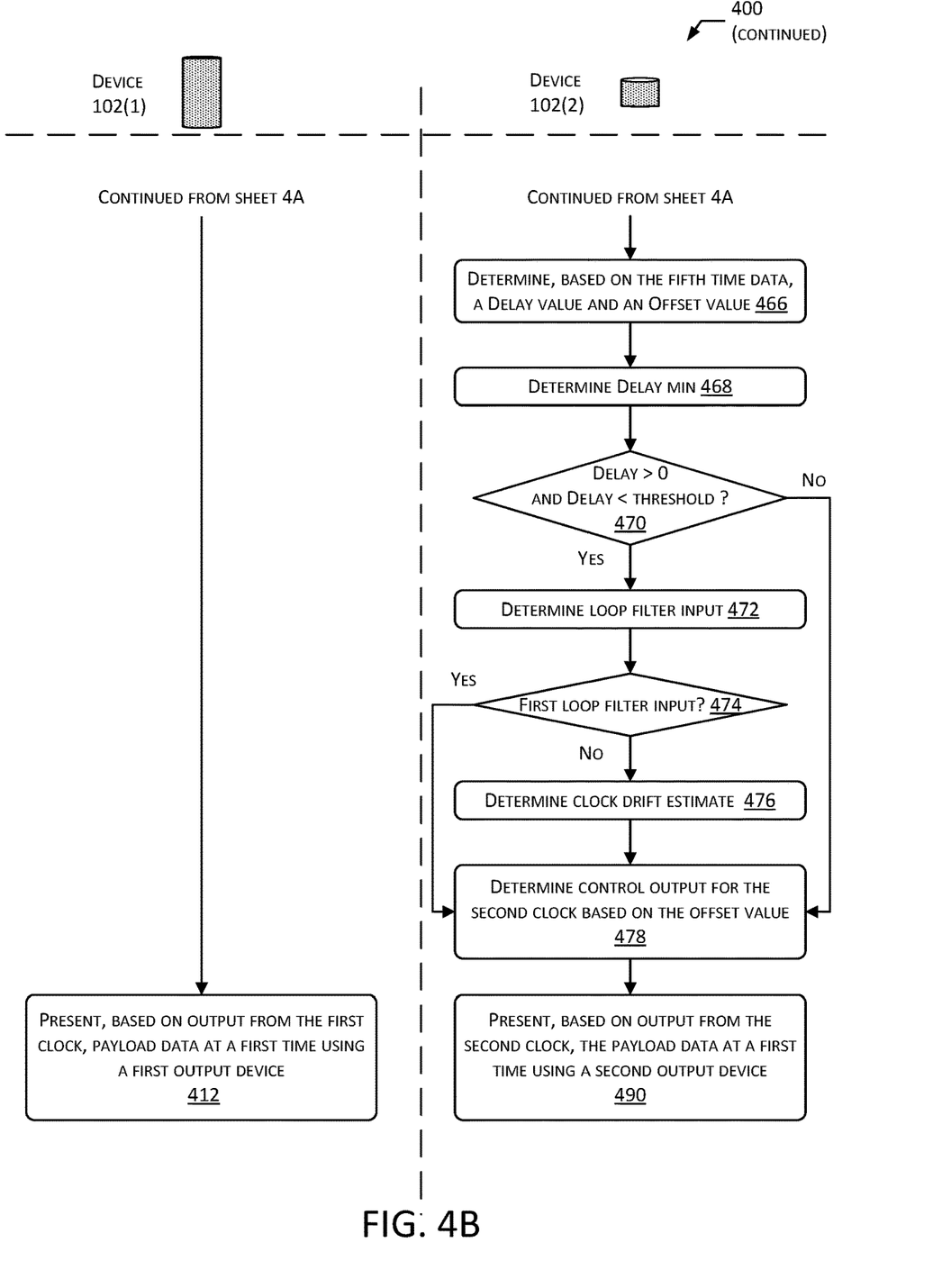

FIGS. 4A and 4B depict a flow diagram 400 of a process for synchronizing a second clock 104(2) of a second device 102(2) with a first clock 104(1) of a first device 102(1), according to some implementations. The process may be executed at least in part by one or more processors 106 of the respective devices 102. In FIG. 4A a hub first device 102(1) and a satellite second device 102(2) are depicted, with time increasing down the page, such that operations depicted at the top of the page occur before operations depicted at the bottom of the page.

At 402 the first device 102(1) determines first time data 166(1) "t0" using a first clock 104(1).

At 404 the first device 102(1) sends a first packet 160(1)(1) comprising the first time data 166(1) "t0" to the second device 102(2). For example, the first device 102(1) may use the first network interface 134(1) to transmit the first packet 160(1)(1). Continuing the example, the first time data 166(1) may comprise or be based on a timestamp associated with processing the first packet 160(1)(1). The first packet 160(1)(1) may comprise header data 162 and payload data 164.

At 452 the second device 102(2) receives the first packet 160(1)(1) from the first device 102(1). The second device 102(2) stores the first time data 166(1) "t0" in the memory 108(2).

At 454 the second device 102(2) determines, using the second clock 104(2), second time data 166(2) "$t_1$" that is associated with reception of the first packet 160(1)(1). For example, the second network interface 134(2) may determine a timestamp associated with processing the received first packet 160(1)(1).

At 456 the second device 102(2) determines, using the second clock 104(2), third time data 166(3) "$t_2$".

At 458 the second device 102(2) sends a second packet 160(2)(1) comprising the third time data 166(3) "$t_2$" to the first device 102(1). For example, the second device 102(2) may use the second network interface 134(2) to transmit the second packet 160(2)(1). Continuing the example, the third time data 166(3) may comprise or be based on a timestamp associated with processing the second packet 160(2)(1). For example, the third time data 166(3) may comprise a value indicative of the timestamp or an index value associated with the timestamp. The second packet 160(2)(1) may comprise header data 162 and payload data 164.

At 406 the first device 102(1) receives the second packet 160(2)(1) from the second device 102(2). The first device 102(1) stores the third time data 166(3) "$t_2$" in the memory 108(1).

At 408 the first device 102(1) determines, using the first clock 104(1), fourth time data 166(4) "$t_3$" that is associated with reception of the second packet 160(2)(1). For example, the first network interface 134(1) may determine a timestamp associated with processing the received second packet 160(2)(1).

At 410 the first device 102(1) sends a third packet 160(1)(2) comprising one or more of the first time data 166(1) "t0", the third time data 166(3) "t2", or the fourth time data 166(4) "t3". For example, the first device 102(1) may use the first network interface 134(1) to transmit the third packet 160(1)(2). The third packet 160(1)(2) may comprise header data 162 and payload data 164.

In some implementations the time data 166 may comprise an index value indicative of previously stored data. For example, the third time data 166(3) "$t_2$" sent by the second device 102(2) in the second packet 160((2)(1) and the third time data 166(3) sent by the first device 102(1) in the third packet 160(1)(2) may comprise an index value specified by the second device 102(2). In some implementations, index values and associated timestamps may be stored in a data structure such as a circular buffer.

In some implementations the third packet 160(1)(2) may comprise information for use in a subsequent iteration of the clock sync module 110. For example, the third packet 160(1)(2) may comprise time data 166 indicative of "t0," based on a timestamp associated with processing the third packet 160(1)(2).

At 460 the second device 102(2) receives the third packet 160(1)(2) from the first device 102(1).

At 462 the second device 102(2) determines, based on one or more of the first packet 160(1)(1), the second packet 160(2)(1), or the third packet 160(1)(2), fifth time data 166(5). For example, the fifth time data 166(5) may comprise t0, $t_1$, $t_2$, and $t_3$. The second device 102(2) stores the fifth time data 166(5) in the memory 108(2).

In some implementations the second device 102(2) may determine information for use in a subsequent iteration of the clock sync module 110. For example, the second network interface 134(2) may determine a timestamp associated with processing the received third packet 160(1)(2).

At 464 the second device 102(2) determines that at least a portion of the fifth time data 166(5) is valid. For example, the second device 102(2) may determine that the $t_2$ index value sent in the third packet 160(1)(2) is a valid index value previously stored in the second device 102(2). In another example, the second device 102(2) may determine that the $t_3$ value is within a threshold range of an expected value.

At 466 the second device 102(2) determines, based on the fifth time data 166(5) a delay value 364 and an offset value 366. For example, the calculation module 362 may use equation 8 to determine the delay value 364 and equation 9 to determine the offset value 366.

At 468 the second device 102(2) determines a delay minimum from a set of delay values 364. For example, the set of delay values 364 may comprise a plurality of delay values 364 calculated as described above. A minimum delay value 364 may be determined from the set of delay values 364. In one implementation, the minimum delay value 364 may be determined as a lower bound of a specified quantile based on a cumulative distribution function of the delay values 364.

The set of delay values 364 may be determined based on one or more of locally calculated delay values 364, or remotely calculated delay values 364 for the same pair of devices 102. For example, locally calculated delay values 364 of the second device 102(2) are determined based on the delay 206 of the packets 160 sent from the first device 102(1) to the second device 102(2). Continuing the example, the remotely calculated delay values 364 may comprise delay values 364 determined by the first device 102(1) based on the delay 206 of packets 160 sent from the second device 102(2) to the first device 102(1). In some implementations the delay values 364 or a minimum of remotely calculated delay values 364 may be included in the time data 166.

At 470 a determination is made with regard to the delay value 364 for a current iteration of the process. If the delay value 364 is greater than a delay threshold value (such as "0") and the delay is less than a threshold value the process may proceed to 472. If not, the process may proceed to 478. In some implementations the threshold value may be based on an Nth quantile of the set of delay values 364. In some implementations, the threshold value may be determined based on experimental data, such as a statistical distribution of delay values 364 that have been previously determined.

At 472 loop filter input is determined. For example, the loop filter input may comprise the delay value 364, offset value 366, or other values based on one or more of the local time data 114, remote time data 116, and so forth. Continuing the example, the loop filter input may comprise local time data 114 that has been modified based on the delay value 364.

At 474 a determination is made as to whether this is a first loop filter input. For example, a first iteration of the process would involve a first input. If yes, the process proceeds to 478. If no, the process proceeds 476.

At 476 a clock drift estimate is determined. For example, the loop filter input is processed by the PID controller module 310 to determine control output data 322 that is representative of the clock drift estimate. The clock drift estimate may represent an estimate of future drift of the second clock 104(2) relative to the first clock 104(1).

At 478 control output for the second clock 104(2) is determined based on the offset value 366. After a plurality of iterations of at least a portion of the process, the time indicated by the second clock 104(2) converges toward synchronization with the time indicated by the first clock 104(1). In some implementations, the updates to the second clock 104(2) may be constrained such that adjustments to the second clock 104(2) are to a future timing interval. For example, the updates may not "roll the second clock back to an earlier time".

In another implementation the updates to the second clock 104(2) may be constrained to a time duration that is less than a sample duration of sample data in the payload data 164. For example, if the payload data 164 may comprise sample data with each instance of sample data representing 8 ms of audio data. Continuing the example, the update to adjust the second clock 104(2) may be constrained to 8 ms or less.

At 490 the second device 102(2) presents, at a first time based on output from the second clock 104(2), sample data that was included in the payload data 164 using a second output device 130(2).

At 412 the first device 102(1) presents, at the first time based on output from the first clock 104(1), the sample data using a first output device 130(1).

The processes and methods discussed in this disclosure may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, physical spaces, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A system comprising:
 a first device comprising;
  a first clock;
  a first network interface;
  a first set of one or more memories storing first computer-executable instructions; and
  a first set of one or more processors to execute the first computer-executable instructions to:
   determine first time data using the first clock;
   receive, using the first network interface, a first packet that includes second time data that is based on a second clock, wherein:
    the first time data comprises third time data and fourth time data, further wherein:
     the third time data is indicative of a time the first packet is received by the first device according to the first clock, and
     the fourth time data is indicative of a time a second packet is sent by the first device according to the first clock; and
    the second time data comprises fifth time data and sixth time data, further wherein:
     the fifth time data is indicative of a time the first packet is sent by a second device according to the second clock of the second device, and
     the sixth time data is indicative of a time the second packet is received by the second device according to the second clock;
   determine output data using the first time data and the second time data as inputs to a phase-locked loop (PLL), wherein the PLL comprises a proportional-integral-derivative (PID) controller as a loop filter; and operate the first clock based at least in part on the output data.

2. The system of claim 1, further comprising the second device, the second device comprising:
the second clock;
a second network interface;
a second set of one or more memories storing second computer-executable instructions; and
a second set of one or more processors to execute the second computer-executable instructions to:
determine the fifth time data using the second clock; and
determine the sixth time data using the second clock; and
the first set of one or more processors to further execute the first computer-executable instructions to:
determine the third time data, using the first clock; and
determine the fourth time data using the first clock.

3. The system of claim 1, the first set of one or more processors to further execute the first computer-executable instructions to:
determine, based on the first clock, an index value indicative of a transmission time for the second packet; and
send, using the first network interface, the second packet comprising the index value.

4. The system of claim 1, further comprising:
the second device comprising:
the second clock;
a second network interface;
a second set of one or more memories storing second computer-executable instructions; and
a second set of one or more processors to execute the second computer-executable instructions to:
determine the second time data using the second clock;
determine header data comprising the second time data;
determine payload data; and
send the first packet, using the second network interface, wherein the first packet comprises the header data and the payload data.

5. The system of claim 1, wherein the output data comprises data indicative of a monotonically increasing change to the first clock.

6. The system of claim 1, wherein the first packet comprises audio data, wherein each instance of the audio data is associated with a first time duration; and
wherein the output data comprises data indicative of a change to the first clock, wherein the change to the first clock has a second time duration that is less than the first time duration.

7. The system of claim 1, wherein the first packet further comprises audio data having a first sampling frequency, and further wherein:
the first clock operates at a first frequency; and
the first sampling frequency is less than the first frequency.

8. A first device comprising:
a first clock;
a first network interface;
one or more memories storing computer-executable instructions; and
one or more processors to execute the computer-executable instructions to:
determine first time data using the first clock;
receive a first packet from a second device, wherein:
the first packet comprises second time data based on a second clock of the second device;
the first time data comprises third time data and fourth time data, further wherein:
the third time data is indicative of a time the first packet is received by the first device according to the first clock, and
the fourth time data is indicative of a time a second packet is sent by the first device according to the first clock; and
the second time data comprises fifth time data and sixth time data, further wherein:
the fifth time data is indicative of a time the first packet is sent by the second device according to the second clock of the second device, and
the sixth time data is indicative of a time the second packet is received by the second device according to the second clock;
determine, using the first time data and the second time data as inputs to a phase-locked loop (PLL), output data, wherein the PLL comprises a proportional-integral-derivative (PID) controller; and
operate the first clock based at least in part on the output data.

9. The first device of claim 8, the one or more processors to further execute the computer-executable instructions to:
determine the fifth time data using the second clock;
determine the third time data, using the first clock;
determine the fourth time data using the first clock; and
determine the sixth time data using the second clock.

10. The first device of claim 8, wherein the first packet comprises payload data;
the first device further comprising an output device; and
the one or more processors to further execute the computer-executable instructions to:
present, using the output device, the payload data based on output from the first clock.

11. The first device of claim 8, wherein the output data after a first iteration comprises adjustments to the first clock that are monotonically increasing.

12. The first device of claim 8, wherein the first packet comprises audio data, wherein each instance of the audio data is associated with a first time duration; and
wherein the output data comprises data indicative of a change to the first clock, wherein the change to the first clock has a second time duration that is less than the first time duration.

13. The first device of claim 8, wherein the first packet further comprises audio data having a first sampling frequency, and further wherein:
the first clock operates at a first frequency;
the second clock operates at a second frequency;
the first sampling frequency is less than the first frequency; and
the first sampling frequency is less than the second frequency.

14. A method comprising:
determining, at a first device, first time data using a first clock;

receiving, at the first device, a first packet that includes second time data, wherein:
    the first time data comprises third time data and fourth time data, further wherein:
        the third time data is indicative of a time the first packet is received by the first device according to the first clock; and
    the second time data comprises fifth time data and sixth time data, further wherein:
        the fifth time data is indicative of a time the first packet is sent by a second device according to a second clock of the second device;
determining, at the first device, using the first time data and the second time data as inputs to a first phase-locked loop (PLL), output data, wherein the first PLL comprises a first proportional-integral-derivative (PID) controller as a loop filter; and
operating, at the first device, the first clock based at least in part on the output data.

15. The method of claim 14, further comprising:
determining the fifth time data using the second clock;
determining the third time data, using the first clock;
determining the fourth time data using the first clock, wherein the fourth time data is indicative of a time a second packet is sent by the first device; and
determining the sixth time data using the second clock, wherein the sixth time data is indicative of a time the second packet is received by the second device.

16. The method of claim 14, wherein the first packet comprises payload data and further comprising:
    presenting the payload data using an output device of the first device that is synchronized to the first clock.

17. The method of claim 14, wherein the first packet comprises:
    header data indicative of the second time data; and
    payload data associated with presentation using one or more output devices.

18. The method of claim 14, wherein the output data comprises data indicative of adjustments to the first clock that are monotonically increasing.

19. The method of claim 14, wherein the first packet further comprises audio data, wherein each instance of the audio data is associated with a first time duration; and
    wherein the output data comprises data indicative of a change to the first clock, wherein the change to the first clock has a second time duration that is less than the first time duration.

20. The method of claim 14, wherein the first packet further comprises audio data having a first sampling frequency, and further wherein:
    the first clock operates at a first frequency; and
    the first sampling frequency is less than the first frequency.

* * * * *

UNITED STATES PATENT AND TRADEMARK OFFICE
CERTIFICATE OF CORRECTION

| | | |
|---|---|---|
| PATENT NO. | : 12,095,895 B1 | Page 1 of 1 |
| APPLICATION NO. | : 17/930572 | |
| DATED | : September 17, 2024 | |
| INVENTOR(S) | : Alexander Kanaris et al. | |

It is certified that error appears in the above-identified patent and that said Letters Patent is hereby corrected as shown below:

In the Claims

Column 12, Claim 1, Line 39:
Currently reads "a first device comprising;"
Where it should read --a first device comprising:--

Signed and Sealed this
Thirty-first Day of December, 2024

Derrick Brent
*Acting Director of the United States Patent and Trademark Office*